(12) United States Patent
Yang et al.

(10) Patent No.: US 9,960,172 B2
(45) Date of Patent: May 1, 2018

(54) RELIABLE NON-VOLATILE MEMORY DEVICE

(71) Applicant: GLOBALFOUNDRIES Singapore Pte. Ltd., Singapore (SG)

(72) Inventors: Jianbo Yang, Singapore (SG); Ling Wu, Singapore (SG); Sung Mun Jung, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 72 days.

(21) Appl. No.: 14/547,155

(22) Filed: Nov. 19, 2014

(65) Prior Publication Data

US 2016/0141296 A1 May 19, 2016

(51) Int. Cl.
*H01L 29/788* (2006.01)
*H01L 27/11521* (2017.01)
*H01L 29/423* (2006.01)
*H01L 29/66* (2006.01)
*H01L 21/28* (2006.01)
*H01L 21/265* (2006.01)

(52) U.S. Cl.
CPC .. *H01L 27/11521* (2013.01); *H01L 21/28273* (2013.01); *H01L 29/42328* (2013.01); *H01L 29/66825* (2013.01); *H01L 29/7883* (2013.01); *H01L 21/26513* (2013.01)

(58) Field of Classification Search
CPC ......... H01L 21/28273; H01L 21/26513; H01L 29/6656; H01L 29/42328; H01L 27/11521
See application file for complete search history.

(56) References Cited

U.S. PATENT DOCUMENTS

| | | | | |
|---|---|---|---|---|
| 6,747,310 B2* | 6/2004 | Fan | ................... | H01L 27/11521 257/316 |
| 7,348,242 B2* | 3/2008 | Choi | .................... | H01L 27/115 257/E21.682 |
| 8,334,560 B2* | 12/2012 | Pan | ................... | H01L 21/28273 257/315 |
| 9,123,822 B2* | 9/2015 | Yoo | ..................... | H01L 29/7881 |
| 2014/0091382 A1* | 4/2014 | Tadayoni | .......... | H01L 21/28273 257/320 |
| 2014/0097480 A1* | 4/2014 | Shum | ................ | H01L 27/11521 257/314 |
| 2014/0126299 A1* | 5/2014 | Fukumoto | .......... | G11C 16/0416 365/185.33 |
| 2015/0021679 A1* | 1/2015 | Tsair | ..................... | H01L 29/788 257/320 |

* cited by examiner

*Primary Examiner* — Jesse Y Miyoshi
*Assistant Examiner* — Tuan A Hoang
(74) *Attorney, Agent, or Firm* — Horizon IP Pte Ltd.

(57) ABSTRACT

Device and method for forming a device are disclosed. The method includes providing a substrate prepared with a memory cell region. At least first and second memory cells are formed on the memory cell region. Each of the memory cells is formed by forming a split gate having first and second gates. The first gate is a storage gate having a control gate over a floating gate and the second gate is a wordline. Re-oxidized layers which extend from top to bottom of the control gate are formed on sidewalls of the control gate. First source/drain (S/D) region is formed adjacent to the second gate and second S/D region is formed adjacent to the first gate. The first and second gates are coupled in series and the second S/D region is a common S/D region for adjacent first and second memory cells. An erase gate is formed over the common S/D region.

14 Claims, 13 Drawing Sheets

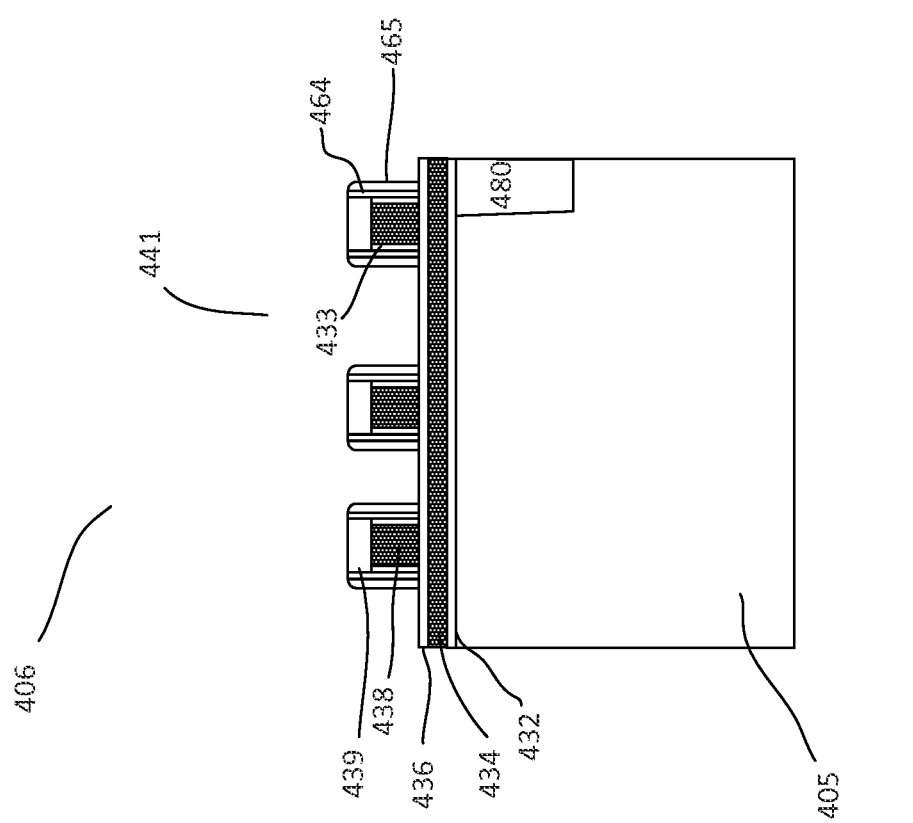

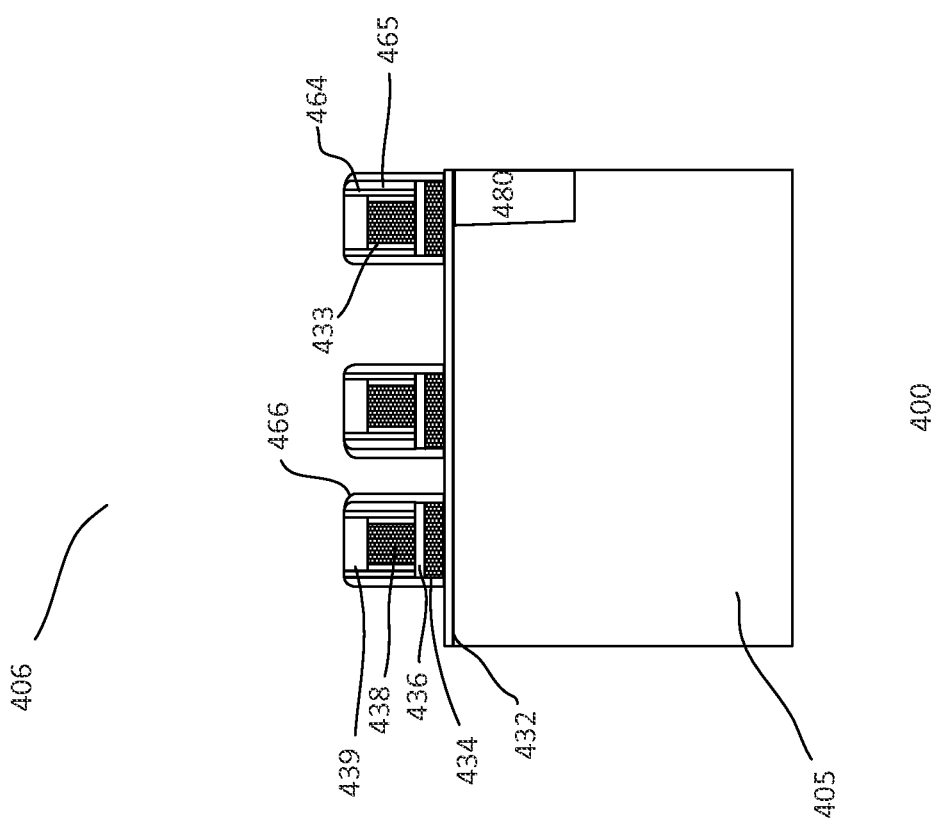

RELIABLE NON-VOLATILE MEMORY DEVICE

BACKGROUND

Non-volatile memory (NVM) devices are able to retain stored data even when the power supply is interrupted. Non-volatile memory devices include flash devices which can be programmed using electrical signals. A NVM device, for example, includes a memory transistor and a select or access transistor in series. The memory transistor stores data programmed into the memory cell, while the access transistor selects the memory cell to be programmed or erased.

The memory transistor can be of various types. For example, the memory transistor may have a stacked gate structure having a control gate over a floating gate and a storage layer sandwiched between control and floating gates. During fabrication of the memory devices, we have observed that silicon substrate gauging and floating gate gauging occur during processing, resulting in potential reliability and yield issues.

The present disclosure is directed to a memory cell with improved performance and reliability and the method of forming thereof.

SUMMARY

Embodiments generally relate to semiconductor device and method for forming a device. In one embodiment, a method for forming a device is disclosed. The method includes providing a substrate prepared with a memory cell region. At least first and second memory cells are formed on the memory cell region. Each of the memory cells is formed by forming a split gate having first and second gates. The first gate is a storage gate having a control gate over a floating gate and the second gate is a wordline. Re-oxidized layers which extend from top to bottom of the control gate are formed on sidewalk of the control gate. First source/drain (S/D) region is formed adjacent to the second gate and second S/D region is formed adjacent to the first gate. The first and second gates are coupled in series and the second S/D region is a common S/D region for adjacent first and second memory cells. An erase gate is formed over the common S/D region.

In another embodiment, a device is presented. The device includes a substrate having a memory cell region. At least first and second memory cells are disposed on the memory cell region. Each of the memory cells includes a split gate having first and second gates. The first gate is a storage gate having a control gate over a floating gate and the second gate is a wordline. Re-oxidized layers are disposed on sidewalls of the control gate. The re-oxidized layer extends from top to bottom of the control gate on sidewalk of the control gate. First source/drain (S/D) region is disposed adjacent to the second gate and second S/D region is disposed adjacent to the first gate. The first and second gates are coupled in series and the second S/D region is a common S/D region for adjacent first and second memory cells. An erase gate disposed over the common S/D region.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following:

FIGS. 4a-4j show an embodiment of a process for forming a device.

DETAILED DESCRIPTION

Embodiments generally relate to semiconductor devices. More particularly, some embodiments relate to memory devices, such as non-volatile memory (NVM) devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, or relate to other types of devices.

Figure 1:
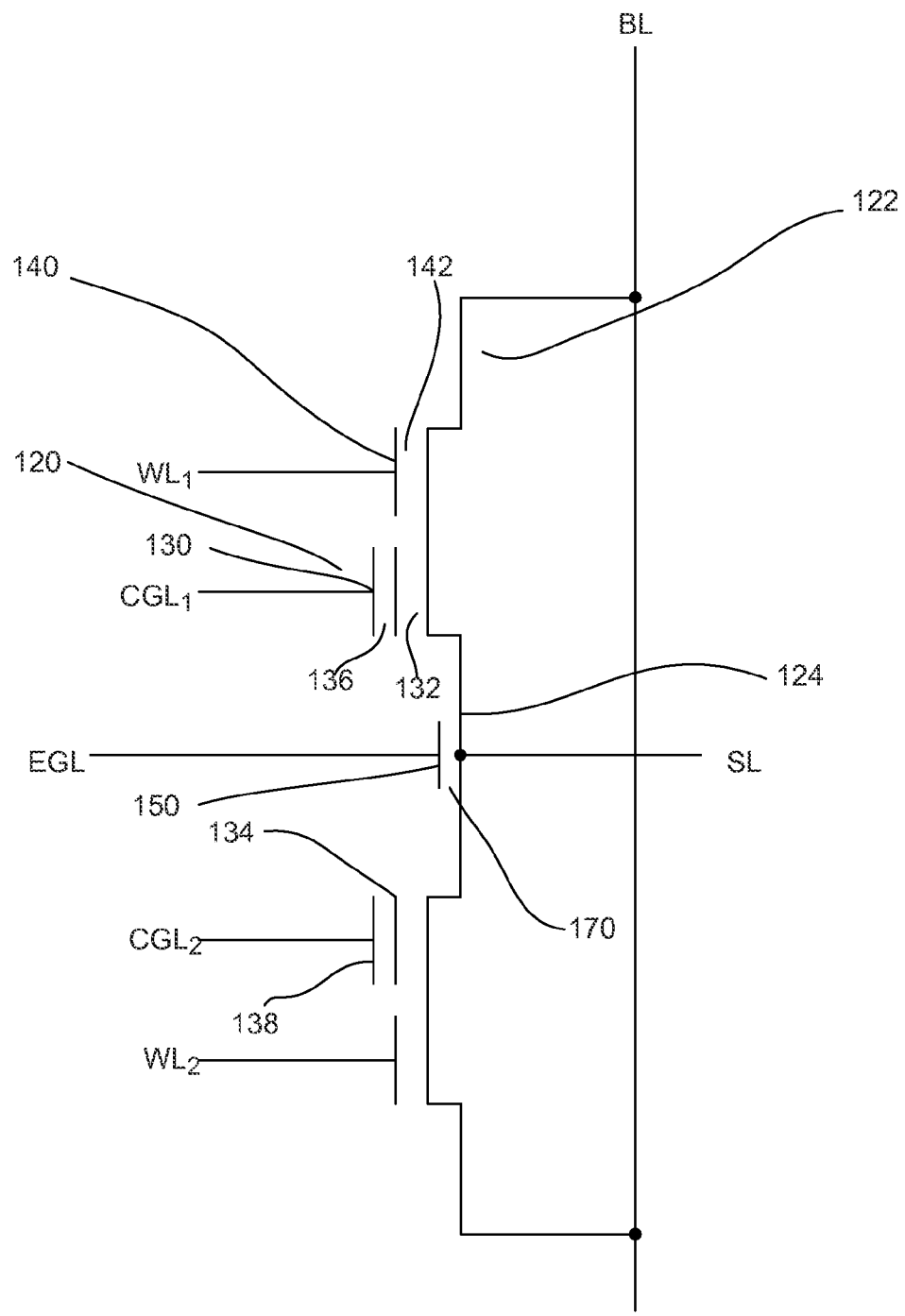
FIG. 1 shows schematic diagram of an embodiment of a device.

FIG. 1 shows a schematic diagram of an embodiment of a device with a memory cell pair 110. For example, the memory cell pair includes first and second memory cells. The memory cells, in one embodiment, are NVM cells. Providing other types of memory cells may also be useful.

A memory cell includes a cell transistor with a gate 120 between terminals 122 and 124. The gate, in one embodiment, is a split gate. For example, the split gate includes first and second gates 130 and 140. The first gate may be referred to as a storage gate. The storage gate includes a control gate 138 and a floating gate 134. The floating gate is separated from a channel of the transistor by a floating gate dielectric 132 and the control gate is separated from the control gate by a storage gate dielectric 136. The control gate is coupled to a control gate line (CGL). As for the second gate, it serves as an access gate. For example, the second gate is an access gate separated from the transistor channel by an access gate dielectric 142. The access gate is coupled to a wordline (WL).

The first terminal is coupled to a bitline (BL). As for the second terminal, it is coupled to a source line (SL). The transistor includes a third gate 150. The third gate serves as an erase gate. The erase gate is provided over the second terminal. The erase gate is separated from the second terminal by an erase gate dielectric 170. The erase gate is coupled to an erase gate line (EGL).

As illustrated, the memory cells of the pair share a common EGL and SL. For example, the second terminals of the first and second cell transistors form a common second terminal and the erase gate is a common erase gate for the first and second cell transistors. A first wordline ($WL_1$) is coupled to the access gate of the first cell transistor and a first control gate line ($CGL_1$) is coupled to the control gate of the first cell transistor; a second wordline ($WL_2$) is coupled to the access gate of the second cell transistor and a second control gate line ($CGL_2$) is coupled to the control gate of the second cell transistor. As for the first terminals of the cell transistors, they are coupled to a common bitline (BL). For example, the cells of the memory cell pair are part of the same column of memory cells. Memory cells may be interconnected by wordlines (WLs), control gate lines (CGLs), erase gate lines (EGLs), source lines (SLs) and bitlines (BLs) to form a memory array.

Figure 2:
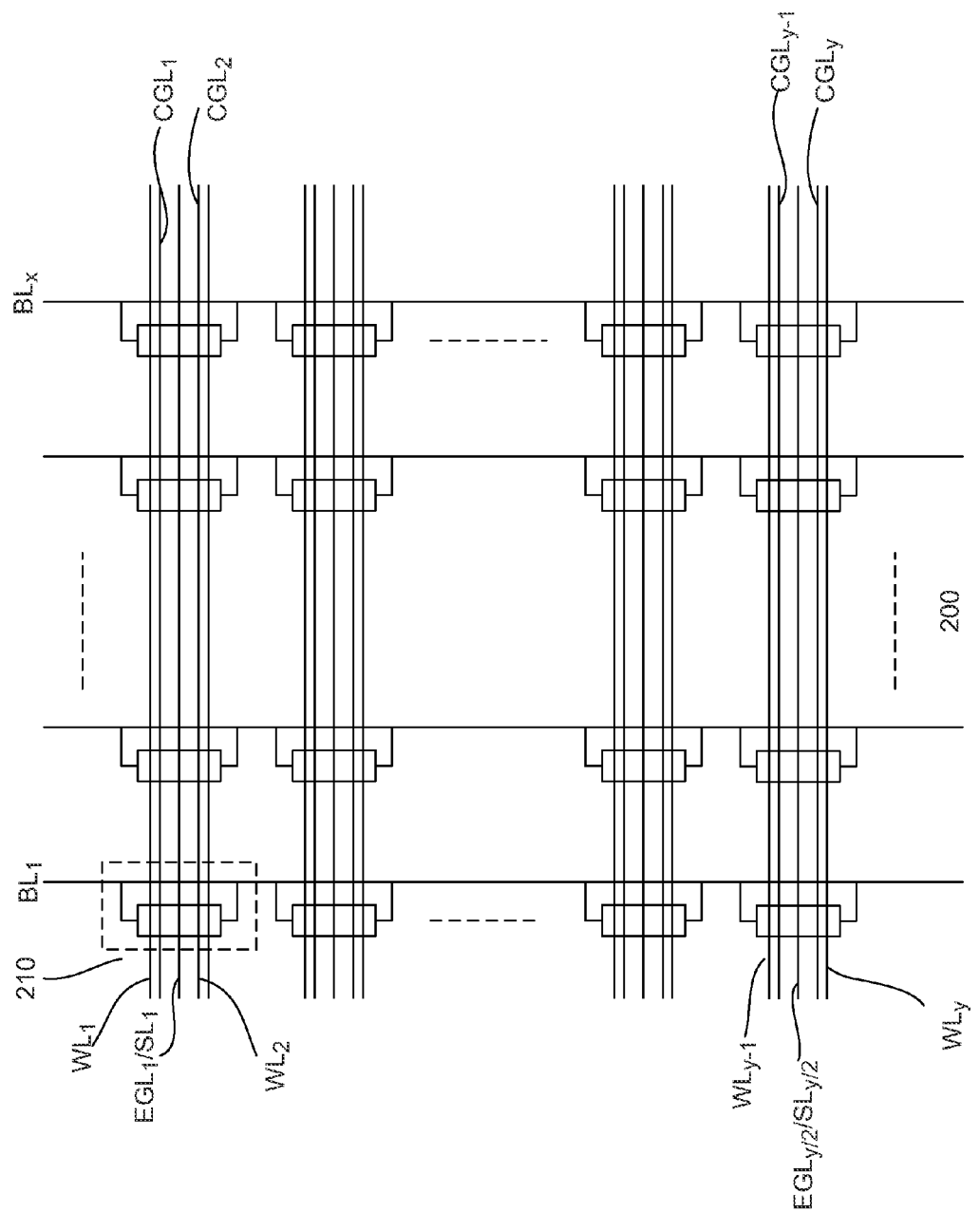
FIG. 2 shows an embodiment of a memory array.

FIG. 2 shows a plurality of memory cell pairs 210 configured to form a memory array 200. The plurality of memory cell pairs of the array are arranged in first and second directions. Memory cells are interconnected in the first direction by wordlines (WLs), control gate lines (CGLs), erase gate lines (EGLs), and source lines (SLs) to form rows of memory cells and in the second direction by bitlines (BLs) to form columns of memory cell. As shown, the array includes y rows and x columns of memory cells. Since EGLs and SLs are common to a pair of memory cells, there are y/2 EGLs and SLs.

Appropriate voltages may be applied to a memory cell via the BL, CGL, WL, EGL and SL to perform different memory operations. The different memory operations may include program, read and erase operations. Table 1 below shows exemplary biasing conditions of the memory array for selected and non-selected cells for different operations.

TABLE 1

| | Signal (V) | | | | | | | | | |
|---|---|---|---|---|---|---|---|---|---|---|
| | WL | | SL | | BL | | CGL | | EGL | |
| Operations | sel | Un-sel | Sel | Un-sel | sel | Un-sel | sel | Un-sel | Sel | unsel |
| Read | $V_{CC}$ | 0 | 0 | $V_{ref}$ | $V_{ref}$ | $V_{CC}$ | 0 | 0 | 0 | 0 |
| Program | $V_t < V < V_{CC}$ | 0 | 4.5 | 0 | <1 | $V_{CC}$ | 10 | 0 | 4.5 | 0 |
| Erase | 0 | 0 | 0 | 0 | 0 | 0 | 0 | 0 | 10-12 | 0 |

The biasing conditions as shown in Table 1 are exemplary. Other suitable biasing conditions may also be useful.

Figure 3:
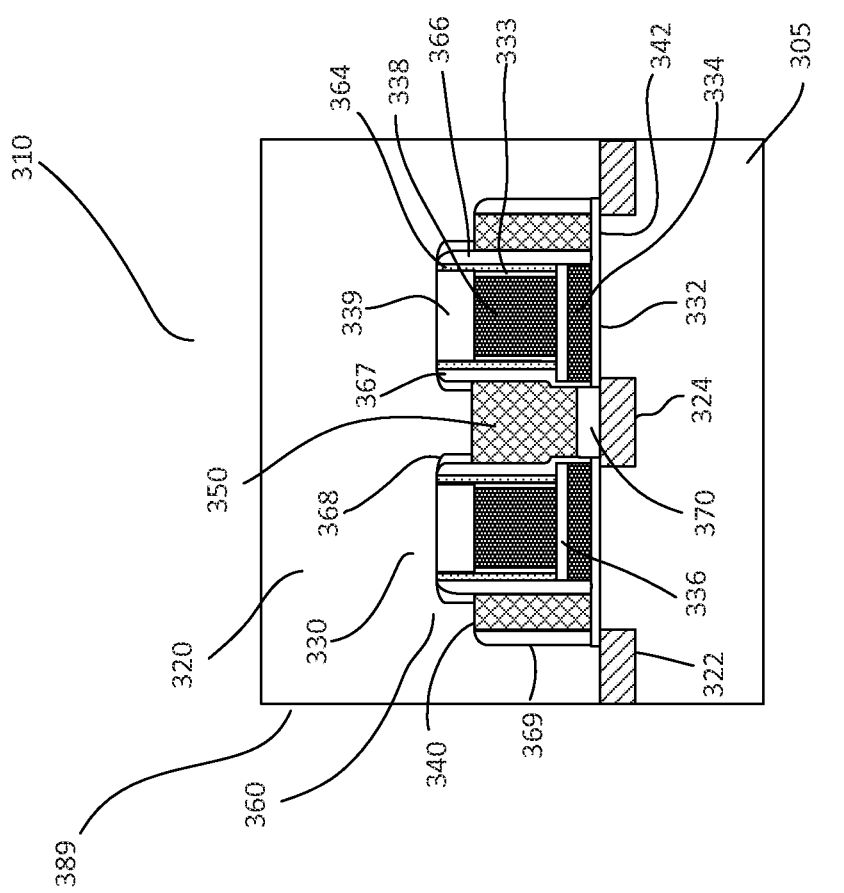
FIG. 3 shows a cross-sectional view of an embodiment of a device.

FIG. 3 shows a cross-sectional view of an embodiment of a device 300. The device includes a substrate 305. The substrate, for example, may be a silicon substrate. The substrate can be lightly doped with p-type dopants. Other types of semiconductor substrates may also be used. For example, the substrate may be silicon germanium or silicon-on-insulator (SOI) as well as intrinsic or doped with other types of dopants or dopant concentrations.

The substrate may be prepared with a memory region containing memory cells of the device. The memory region can be referred to as an array region. Providing a substrate prepared with other types of regions (not shown) may also be useful. For example, the substrate may include a logic region for support or other types of logic circuitry. The substrate may also include regions for other types of circuitry, depending on the type of device or IC. For example, the logic region may include sub-regions for high voltage (HV), medium voltage (MV) and low voltage (LV) devices.

As shown, the memory region includes a pair of memory cells 310. In one embodiment, the memory cells are NVM memory cells. Providing other types of memory cells may also be useful. The pair of memory cells may be adjacent memory cells of a column of memory cells. It is understood that the cell region includes numerous memory cells arranged in columns and rows to form a memory array. The array may be configured to have sub-arrays or sectors.

The array region may include a doped well (not shown) with dopants of a second polarity type. The doped well may be intermediately or heavily doped. Providing a doped well having other dopant concentrations may also be useful. The doped well may be a common doped well in the array region for the memory cells. In one embodiment, the array well is biased at an array well bias voltage ($V_{bias}$). In one embodiment, $V_{bias}$ is about 0V. The second polarity type doped welt serves as a well for a first polarity type device. In one embodiment, the second polarity type includes p-type. For example, the p-type doped well serves as a well for a n-type memory cell. Providing a n-type doped well may also be useful. For example, a n-type doped well serves as a well for p-type memory cells. P-type dopants can include boron (B), aluminum (Al), indium (In) or a combination thereof while n-type dopants can include phosphorus (P), arsenic (As), antimony (Sb) or a combination thereof.

The substrate includes isolation regions (not shown) to isolate active device regions from other active device regions, as required. The isolation regions, for example, are shallow trench isolation (STI) regions. Other types of isolation regions are also useful. For example, isolation regions may be used to isolate rows and columns of memory cells.

A memory cell includes a cell transistor with a gate 320 between first and second cell terminals or source/drain (S/D) regions 322 and 324. The gate, in one embodiment, is a split gate. For example, the split gate includes first and second gates 330 and 340. The first gate, for example, is a storage gate. The storage gate includes a control gate 338 and a floating gate 334. The gates, for example, are polysilicon gates. The gates may be formed by, for example, chemical vapor deposition (CVD). Other suitable types of gates or forming techniques may also be useful. The floating gate is separated from the substrate by a floating gate dielectric 332 and the control gate is separated from the floating gate by a storage gate dielectric 336. The floating gate dielectric, in one embodiment, is a thermal oxide. As for the storage gate dielectric, it is an oxide/nitride/oxide (ONO) stack. The ONO stack may be formed by, for example, CVD. Other suitable types of floating gate or storage gate dielectrics as well as forming techniques may also be useful.

The storage gate includes a hard mask layer 339 over it. For example, the hard mask is disposed over the control gate. The hard mask, for example, is silicon oxide. The hard mask, for example, may be formed by CVD. Other suitable types of hard mask or dielectric materials and forming techniques may also be useful.

In one embodiment, sidewalk of the control gate include reoxidized layers 333. The re-oxidized layers, for example, may be formed by oxidizing the exposed sidewalls of the control gate. As shown in FIG. 3, the re-oxidized layer extends from the top to the bottom of the control gate on sidewalls of the control gate. The re-oxidized layers may be about, for example, 50 Å thick. Other suitable thicknesses may also be useful. As shown, the outer surfaces of the re-oxidized layers are aligned with sides of the hard mask layer.

As for the second gate 340, it serves as an access gate or wordline. The second gate is disposed adjacent to the storage gate and first cell terminal 322. The second or access gate is separated from the substrate by an access gate dielectric 342.

The access gate or wordline, for example, may be polysilicon. The access gate may be formed by CVD. Other suitable types of access gates or forming techniques may also be useful. The access gate dielectric may be thermal oxide. For example, the access gate dielectric and floating gate dielectric may be formed of the same thermal oxide layer. Other suitable configurations of the access gate may also be useful. The storage gate and access gate may be gate conductors. For example, the gates form common gates for a row of memory cells.

The first and second cell terminals or S/D regions 322 and 324 are heavily doped first polarity type doped regions. For example, first polarity type doped S/D regions are for first polarity type cell transistors. In one embodiment, the first polarity type is n-type for a n-type cell transistor. Providing p-type S/D regions may also be useful for p-type cell transistors. In one embodiment, the second S/D region 324 serves as a SL of the memory cell. The second S/D region, for example, is a common S/D region for a row of memory cells.

A third gate 350 is disposed over the second S/D region. The third gate serves as an erase gate. The erase gate, for example, is a polysilicon gate formed by CVD. Other suitable types of gate materials or forming techniques may also be useful. The erase gate is isolated from the second S/D region by an erase gate dielectric 370. The erase gate dielectric, for example, is a thermal oxide layer. Other suitable dielectric materials may also be used as the erase gate dielectric. The thickness of the erase gate dielectric should be sufficient to electrically isolate the erase gate from the second S/D region.

Dielectric spacers 360 may be provided on sidewalk of the gates. The spacers may provide electrical separation between the gates and may serve to facilitate forming LDD and halo regions (not shown) in the S/D regions. The spacers may be spacer stacks having multiple dielectric layers. In one embodiment, sidewalk of the storage gate are lined with a nitride spacer 364. To form the nitride spacers, the nitride layer may be formed and anisotropically etched, leaving spacers on the sidewalk. The nitride layer, for example, is formed by CVD. The nitride spacers, for example, may serve as control gate spacers. In one embodiment, upper portions of the nitride spacers directly contact the sides of the hard mask layer on top of the control gate. A first high temperature oxide (HTO) spacer 366 is disposed on the nitride spacer on the access gate side of the control gate. The first HTO spacer serves as a floating gate spacer, separating the access gate or wordline from the floating gate. A second HTO spacer 367 is disposed on the nitride spacer on the erase gate side of the control gate. A lower portion of the second HTO spacer serves as a tunneling oxide between the floating gate and erase gate. As for the spacer 369 on sidewall of the access gate adjacent to the first cell terminal and spacer 368 on sides of the control gate above the access gate and erase gate, it includes a low temperature oxide (LTO) and nitride. The spacers, for example, are formed using spacer techniques, such as anisotropically etching the layers to remove horizontal portions while vertical portions of the layers remain as the spacers. Other suitable configurations of spacers may also be useful.

In one embodiment, the storage gate dielectric, floating gate electrode and floating gate dielectric are wider than the control gate. For example, the access gate side of the storage gate dielectric and floating gate electrode are aligned with the nitride spacer. As for the erase gate side of the floating gate, the storage gate dielectric and floating gate electrode extend beyond the nitride spacer.

The cell transistors of the memory cell pair share a common second S/D region. Likewise, the cell transistors of the memory cell pair share a common erase gate. An EGL is coupled to the erase gate and a SL is coupled to the second S/D region. A first wordline ($WL_1$) is coupled to the second gate of the first cell transistor and a first control gate line ($CGL_1$) is coupled to the second gate of the first cell transistor; a second wordline ($WL_2$) is coupled to the access gate of the second cell transistor and a second control gate line ($CGL_2$) is coupled to the control gate of the second cell transistor. Alternatively, the second gate of the first cell transistor serves as the first wordline while the second gate of the second cell transistor serves as the second wordline. As for the first terminals of the cell transistors, they are coupled to a common bitline (BL). For example, the cells of the memory cell pair are part of the same column of memory cells. Memory cells may be interconnected by WLs, CGLs, EGLs, SLs and BLs to form a memory array.

A dielectric layer 389 is disposed over the memory cell. The dielectric layer, for example, serves as a contact level of an interlevel dielectric (ILD) layer. For example, the dielectric layer serves as a contact level or CA level of the first ILD level or layer. Contacts (not shown) are formed to the various terminals of the memory cell. For example, contacts are coupled to the first and second S/D regions, control gates and access gates of the memory cell. Contact in the CA level may be tungsten contacts. Other suitable types of contacts may also be useful. Conductive lines may be provided in a metal level of the ILD layer above the contact level dielectric layer. For example, conductive lines may be provided in the first metal level (M1) of the first ILD layer. Conductive lines in M1 may be copper conductive lines. Contacts and conductive lines in CA and M1 may be formed by single damascene techniques. Additional ILD layers with contact and metal levels are provided. Contacts and conductive lines in the additional ILD layers may be copper contacts and formed by, for example, dual damascene technique.

Lines disposed in the same direction may be provided in the same metal level. Different direction lines are provided in different metal levels. For example, in the case where CGLs, WLs, SLs and EGLs are disposed in a first direction, they may be disposed in the same metal level, such as M1 while BLs which are disposed in a second direction, may be provided in a different metal level, such as the second metal level (M2). Other suitable configurations of conductive lines may also be useful.

FIGS. 4a-4j show cross-sectional views of an embodiment of a process 400 for forming a device. The cross-sectional views, for example, are along the bitline direction of the device. The device, for example, is similar to that described in FIGS. 1-3. Common elements may not be described or described in detail. The cross-sectional views illustrate a portion of the device. For example, the cross-sectional views illustrate a portion of the array region of the device. As discussed, the device may include other device regions (not shown), such as logic regions, including HV and LV regions. The various regions include device wells for respective devices. For example, array region includes an array well while HV regions include HV p wells for HV n-type devices and HV n wells for HV p-type devices and LV regions include LV p wells for LV n-type devices and LV n wells for LV p-type devices.

Figure 4A:
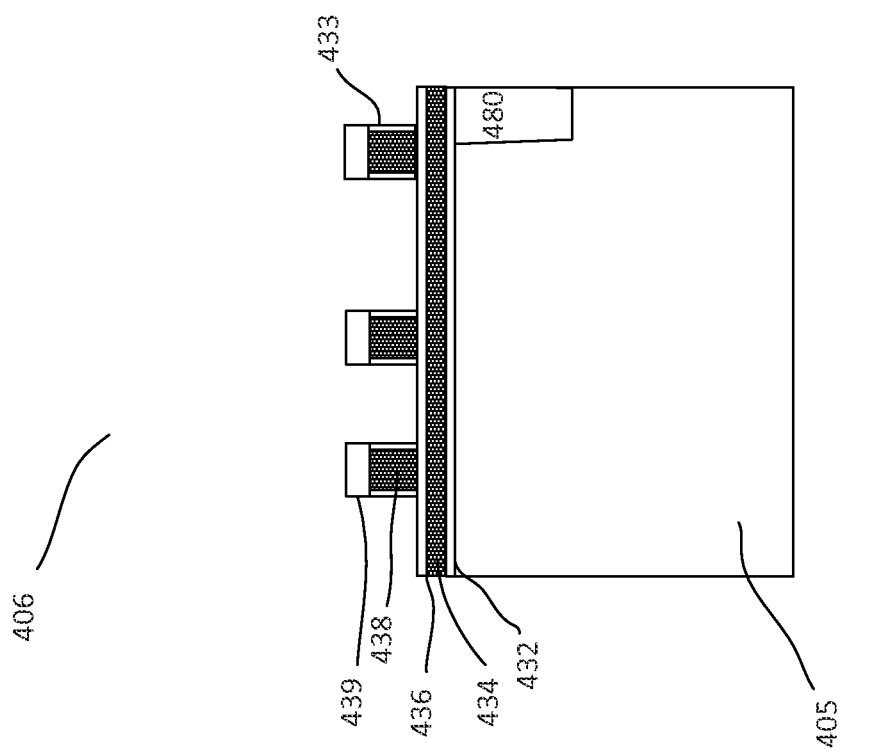

Referring to FIG. 4a, initial front end of line (FEOL) processing is performed on the substrate 405. For example, the substrate is prepared with isolation regions 480, such as shallow trench isolation (STI) regions, defining active regions of the device. For example, exposed portions of the substrate not filled with isolation regions serve as active regions of the device. The active regions, for example, include array, HV and LV regions. Other regions may also be included.

After forming the isolation regions, wells are formed in the substrate. For example, doped wells are formed in the array region 406 and the logic region. The logic region, for example, may include HV and LV regions. The wells may be formed by performing ion implantation using implant masks, such as photoresist. Different wells are formed using different implant processes.

Various gate layers are formed on the substrate. This, for example, includes forming a floating gate dielectric layer 432, a floating gate electrode layer 434, a storage gate dielectric layer 436, a control gate electrode layer, and a hard mask layer. The storage gate dielectric layer 436, for example, is an ONO stack. The process includes patterning some of the gate layers. The hard mask and control gate electrode layers are patterned to form control gates in the array region. For example, the hard mask and control gate electrode layers are selectively patterned to form patterned hard mask 439 and control gates 438. Illustratively, the portion of the array includes three control gates. One of the gates shown is in an edge of the array region. This gate, for example, may be an inactive or dummy gate. The other two gates are of memory cells of a memory cell pair corresponding to two adjacent rows which share a common SL which will be described later. It is understood that an array includes many more memory cell pairs which form columns and rows of memory cells. Additionally, hard mask and control gate electrode layers in the non-array regions are removed. For example, the hard mask and control gate electrode layers above the storage gate dielectric layer are removed in the non-array regions.

Patterning the gate layers may be achieved using mask and etch techniques. For example, a patterned resist mask may be employed to serve as an etch mask. Patterning the resist mask may be performed by selectively exposing a resist layer with an exposure source using a reticle. The pattern of the reticle is transferred to the resist layer after exposure by a development process. The patterned resist layer serves as an etch mask for an anisotropic etch, such as a reactive ion etch (RIE). The etch transfers the pattern of the mask to the underlying layers. In one embodiment, the etch removes exposed portions of the hard mask and control gate electrode layers not covered by the patterned resist mask in the array and non-array regions. The etch removes exposed portions of the hard mask layer, followed by removing exposed portions of the control gate electrode layer. In one embodiment, the etch process is highly selective to the material of the control gate electrode layer and the etch stops on top of the storage gate dielectric layer or ONO stack. For example, the etch is highly selective to the polysilicon material of the control gate electrode layer and may over etch to stop at the nitride layer of the ONO stack of the storage gate dielectric layer.

In one embodiment, the substrate is subjected to an oxidation process. The oxidation process, for example, includes an anneal in oxygen containing ambient. The oxidation process forms re-oxidized layers 433 on exposed polysilicon sidewalls of the control gates 438. The re-oxidized layers, for example, are about 50 Å thick. Other suitable thicknesses, for example, may also be useful. As shown in FIG. 4a, the re-oxidized layers are aligned with sides of the hard mask 439. The re-oxidized layers, as shown, extend from the top to the bottom of the control gate on exposed polysilicon sidewalk of the control gate.

Figure 4B:
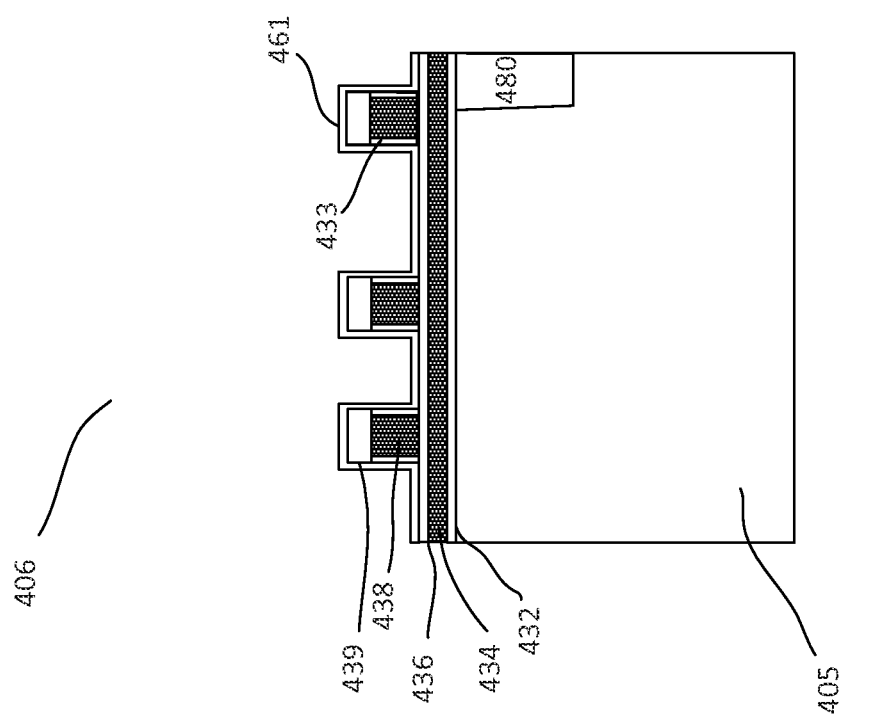

In FIG. 4b, a spacer layer is 461 is formed on the substrate. The spacer layer lines the surface of the substrate. For example, the spacer layer lines the exposed portions of the storage gate dielectric layer, re-oxidized layers and hard mask in the array region and storage gate dielectric layer in the non-array or logic region. In one embodiment, the spacer layer is a nitride layer formed by CVD. Other suitable types of dielectric spacer layers which, for example, can be selectively etched to the storage gate dielectric layer may also be useful.

Figure 4C:
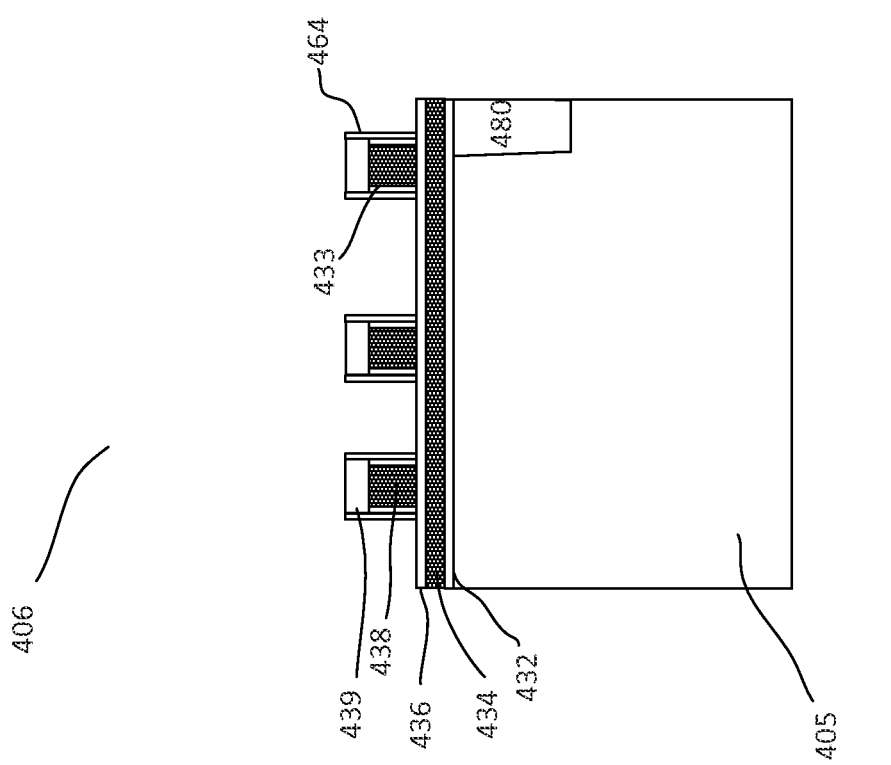

An anisotropic etch, such as a RIE, is performed, as shown in FIG. 4c. The etch, for example, removes horizontal portions of the spacer layer selectively to the storage gate dielectric layer, forming nitride spacers 464 on sidewalk of the control gate while leaving the storage gate dielectric layer remaining. For example, control gate spacers 464 are formed on the sidewalk of the hard mask and sidewalls of the control gate over the re-oxidized layers 433.

Referring to FIG. 4d, sacrificial spacers 465 are formed on sidewalk of the nitride spacers. The sacrificial spacers, for example, are oxide spacers. The spacers may be formed by forming a spacer layer on the substrate, such as an oxide spacer layer. The spacer layer may be formed by CVD. Other suitable techniques for forming the spacer layer may also be useful. A RIE is performed on the spacer layer, removing the horizontal portions to form the sacrificial spacers.

A gate threshold voltage (Vt) adjustment implant may be performed for the wordline. The implant may be performed using an implant mask (not shown). For example, the implant mask may be a resist mask with openings to the region 441 where access gate or wordline is to be formed. The opening may also expose a portion of the control gate on the access gate side.

Figure 4E:
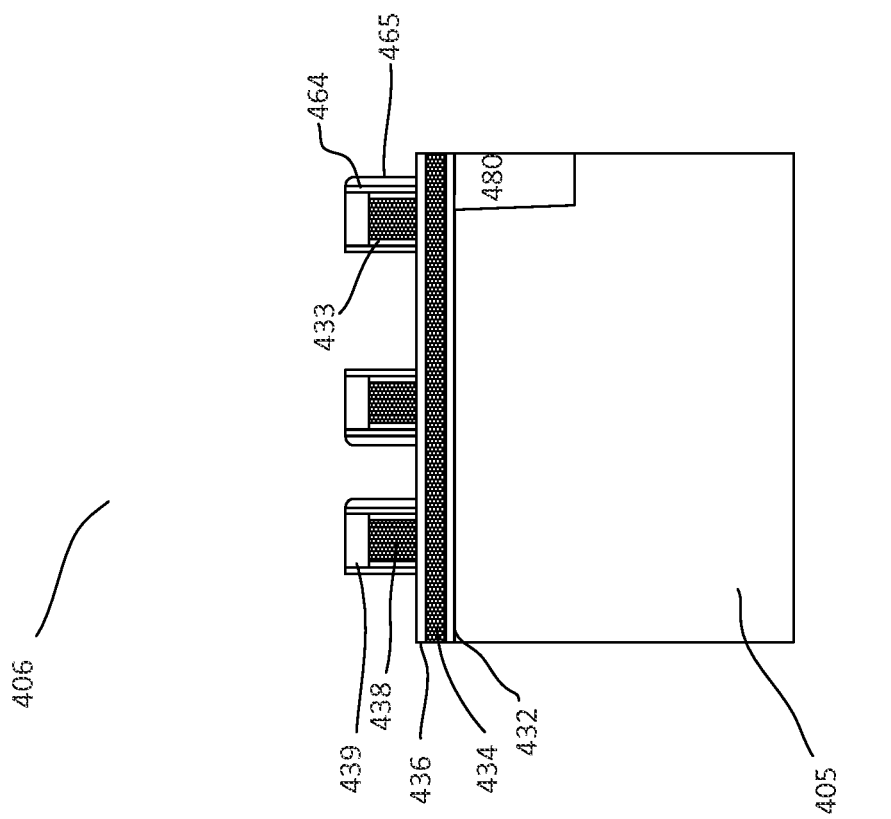

In FIG. 4e, after the Vt adjustment implant, the sacrificial spacers on the access gate side of the control gates are removed. For example, the sacrificial spacers exposed by the implant mask are removed. Removal of the exposed sacrificial spacers may be achieved by, for example, a wet etch. Thereafter, the implant mask is removed by, for example, ashing. Other suitable removal techniques may also be employed.

As shown in FIG. 4f, the process continues with a removal process. For example, a RIE is performed on the substrate. The etch removes exposed portions of the storage gate dielectric layer and underlying floating gate electrode layer in the array and non array regions. The hard mask and spacers on the control gate serve as an etch mask for the RIE. The RIE, illustratively, keeps the underlying floating gate dielectric layer remains over the substrate. The etch forms or defines the floating gates. The control and floating gates together serve as a first or storage gate of a transistor of a memory cell.

After patterning to substrate to form the floating gates, floating gate spacers 466 are formed. To form the floating gate spacers, a floating gate spacer layer is formed on the substrate. The floating gate spacer layer, for example, is a first HTO spacer layer. A RIE is performed to remove horizontal portions of the spacer layer, leaving floating gate spacers on sidewalls of the first gates, including the floating gates.

The process may continue to process the logic region (not shown). For example, the HV regions may be selectively processed. To selectively process the HV regions, a resist mask may be used to protect the other regions, such as the array and LV regions while leaving the HV regions exposed for processing. Processing of the HV regions includes, for example, removing oxide in the HV region. After removing the oxide in the HV region, the resist mask is removed. For example the resist mask is removed by ashing followed by a resist clean.

A HV oxide layer is formed in the non-array region on the substrate. Forming the HV oxide may include a multi-step process. For example, a rapid thermal oxidation (RTO) is first performed to form a RTO oxide layer. Afterwards, a HTO oxide layer is formed. To form the HTO oxide layer, a HTO oxide layer is formed by, for example, CVD followed by a HTO anneal. Other suitable techniques for forming the RV oxide layer may also be useful.

Figure 4G:
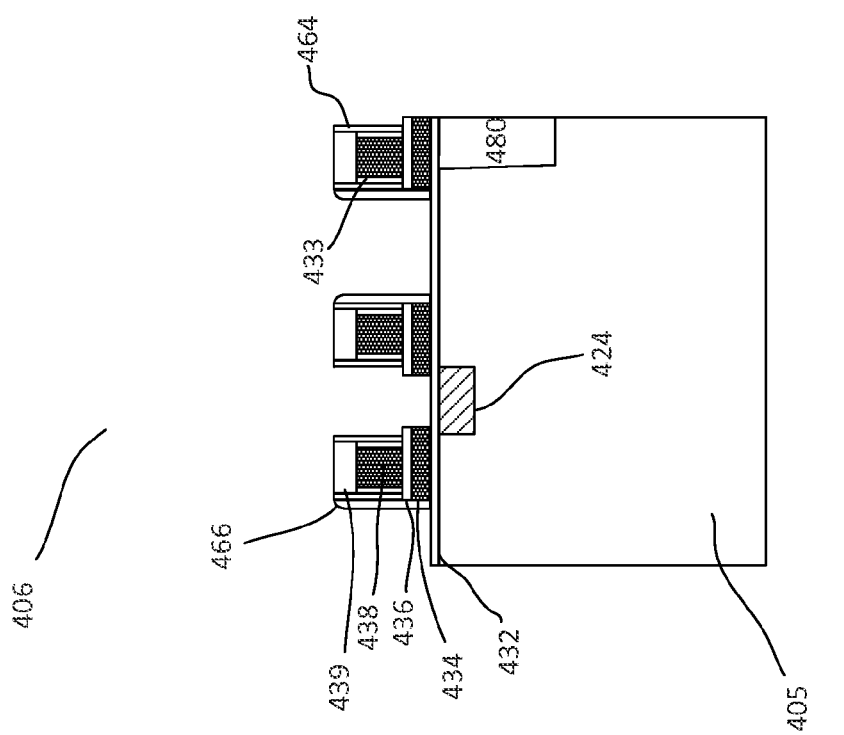

Referring to FIG. 4g, a buried SL 424 is formed between memory cells of a memory cell pair. In one embodiment, an implant is performed to form the buried SL. An implant mask (not shown), such as a photoresist mask, may be employed. The implant mask includes an opening exposing the substrate where the SL is to be formed. First polarity type dopants are implanted into the substrate to form the buried SL. The buried SL, for example, is a heavily doped region with first polarity type dopants. In one embodiment, the buried SL is disposed between the memory cells of a memory cell pair and extends a length of a row of memory cells.

After forming the SL, oxide exposed by the implant window of the mask is removed. For example, the HV oxide layer and oxide spacers on the erase gate side of the first gates are removed. Removing the exposed oxide may be achieved using a wet etch selective to the substrate material, such as silicon. Other suitable techniques for removing the exposed oxide may also be useful. The substrate may be annealed. For example, the substrate is annealed to diffuse the first polarity type dopants to form the buried SL. After annealing the substrate, the implant mask is removed, for example, by ashing.

Figure 4H:
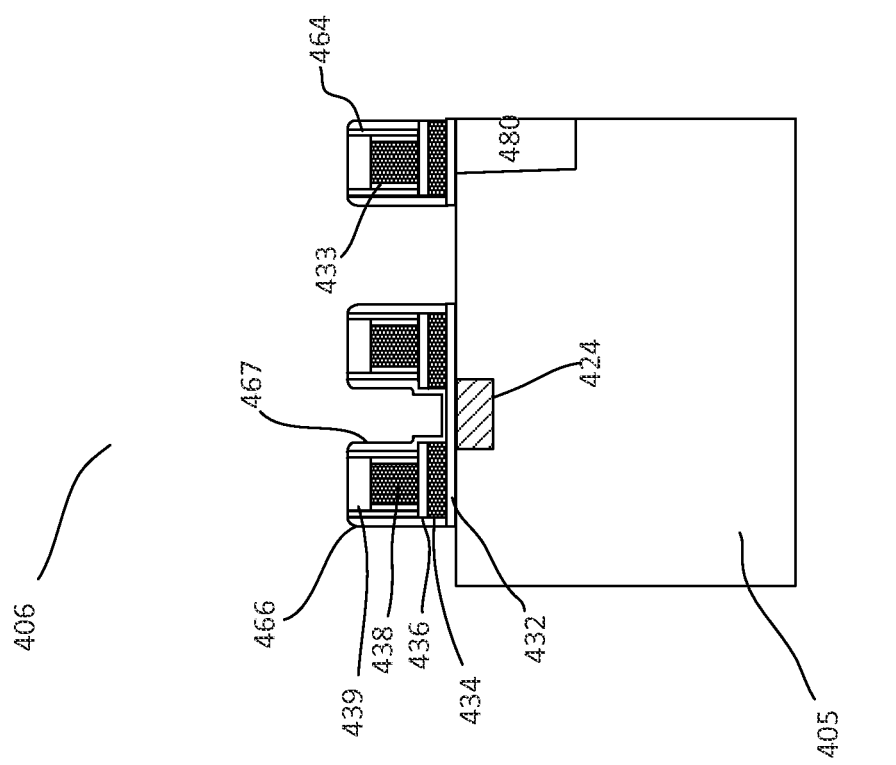

In FIG. 4h, an oxide layer is formed on the substrate. The oxide layer, for example, is a HTO oxide layer. The HTO oxide layer is deposited by CVD and annealed. The HTO oxide layer is processed to form spacers on sidewalk of the erase gate side of the gates and a tunneling oxide over the SL. A resist mask may be provided to protect the erase gate side of the gates from an etch while other regions, including the substrate between the access gate sides of the gates are exposed. In one embodiment, the resist may also protect the HV regions from being processed, leaving the LV regions exposed. The etch removes exposed oxide. The etch may be a multi-etch process. For example, the etch may include a dry etch followed by a wet etch. Other suitable techniques for processing the tunneling oxide layer to form spacers and tunneling oxide layer 467 over the SL region may also be useful. Active regions in the LV regions exposed by the mask may also be processed to remove oxide to expose the substrate. After processing, the resist mask is removed by, for example, ashing.

Figure 4I:
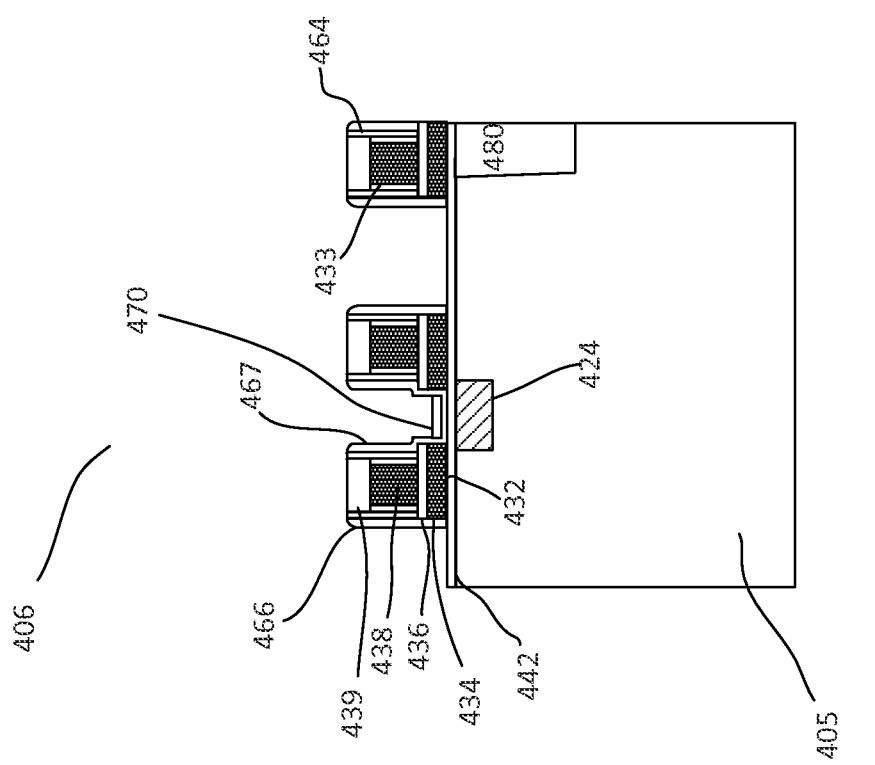

The process continues to form gate dielectric on the substrate for the access gate or wordline, as shown in FIG. 4i. In one embodiment, a thermal oxide is performed to form access gate dielectric 442. The thermal oxide is formed on the whole substrate, including the logic regions. This also forms an erase gate dielectric 470 over the buried SL.

In one embodiment, the LV regions may include different gate oxides. For example, LV regions may include first and second LV regions having first and second gate dielectric thicknesses. For example, forming access gate dielectric also forms first gate dielectric in the first LV regions. After forming the access gate dielectric and first gate dielectric, the second LV regions is processed to form the second gate dielectric. Forming second gate dielectric includes, for example, forming a mask to protect device regions except the second LV regions. An etch is performed to remove oxide in the second LV regions, followed by thermal oxidation process to form the second gate dielectric in the second LV regions. In one embodiment, the second LV regions have thinner gate dielectrics than the first LV regions.

Figure 4J:
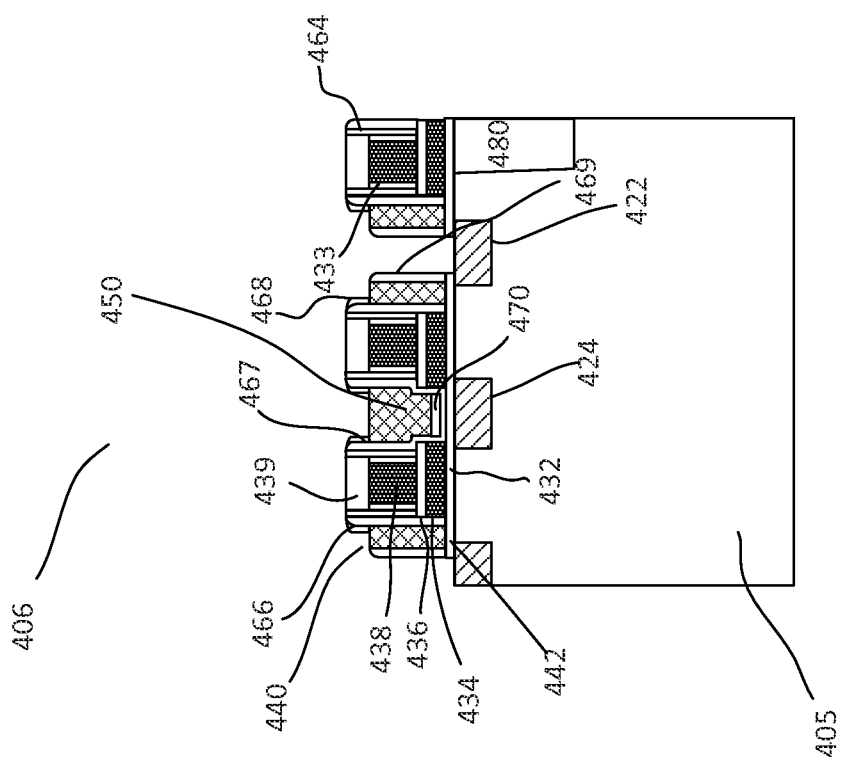

Referring to FIG. 4j, wordlines 440 and an erase gate 450 over the buried SL are formed. In one embodiment, forming the wordlines and erase gates also forms gates in the logic regions, including HV and LV regions. To form the gates, gate electrode layers are formed over the substrate. The gate electrode layers fill the gaps and cover the storage gates in the array region and gate dielectric layers in the HV and LV regions. The gate electrode layers, for example, are polysilicon. The polysilicon may be doped polysilicon, for example, to reduce sheet resistance. The polysilicon may be doped with first polarity type dopants.

In one embodiment, first and second gate electrode layers are formed on the substrate. The gate electrode layers are separated by an etch stop layer in the logic region. This can be achieved by depositing the etch stop layer over the first gate electrode layer and patterning it to remove it from the array region prior to forming the second gate electrode layer. The height of the first electrode layer is equal to about the desired height of the gates in the logic regions. The top surface of the etch stop layer may be slightly above or below a top surface of the hard mask over the storage gates. In one embodiment, the top surface of the etch stop layer is disposed slightly below the top surface of the hard mask over the storage gates. The etch stop layer, for example, is an oxide layer. Other suitable type of etch stop layers may also be useful. The use of the etch stop layer facilitates forming gates in the array region having a different height than the gates in the logic regions. For example, the etch stop layer facilitates forming gates in the array region having a higher height than the gates in the logic regions.

An etch back is performed to recess the gate electrode layer to a desired height in the array region. For example, the etch back recesses the gate electrode layers to the height of the erase and wordlines. In the case where the etch stop layer is slightly below the height of the hard mask layer over the storage gates, gate electrode material over the etch stop layer is removed to expose the etch stop layer. An etch is performed to remove the etch stop layer. For example, the etch may be a wet etch selective to substrate material, such as silicon. The etch removes the etch stop layer, exposing the first gate electrode layer in the logic regions.

The gate electrode layer or layers are patterned to form wordlines in the array region and gates in the logic regions. In one embodiment, a mask, such as a resist mask, is employed to pattern the gate electrode layer to form the gates. The mask protects the region over the erase gate 450, since it is already formed, and other regions where wordlines 440 and logic gates are formed. The etch, for example, is a RIE. After the gates are formed, sidewall spacers 468 and 469 are formed on sidewalls of the wordlines and exposed portions of the storage gate as well as sidewalk of the logic gates.

Source/drain regions or first cell terminals 422 of transistors and memory cells are formed after forming the gates. Source/drain regions of the logic transistors may also be formed. In the case of first and second polarity type transistors, the source/drain regions are formed using separate implant processes. In one embodiment, LDD and halo regions are formed prior to forming spacers and source/drain regions are formed after spacer formation.

The process continues with back end of line (BEOL) processing to form interconnects and passivation. After BEOL is completed, the wafer is diced into individual chips, assembled and tested. Other suitable processes may also be included.

The embodiments as described result in advantages. For example, during formation of the control gates, the etch stops on top of the storage gate dielectric layer. Thus, the underlying floating gate electrode layer is not processed or consumed during formation of the control gates. Since the floating gate electrode layer is preserved or not removed when the control gates are defined, this provides better control of floating gate electrode thickness and avoids floating gate gauging as well as silicon substrate gauging. This also allows the floating gate electrode to shrink further without the silicon gauging concern. In addition, the embodiment as described in FIGS. 4a-4j provides lower NVM cell stack which is closer to logic stack to be formed, enabling better control of process margin. Furthermore, since hard mask which is used to define the control gate is less consumed by this process, allowing a thinner hard mask layer to be used. This provides more margins for control gate etch tuning, leading to better control gate profile and critical dimension (CD) uniformity. Moreover, the method as described in FIGS. 4a-4j is highly compatible with current logic processing and no additional investment in new equipment is required. Therefore, a more reliable NVM device can be formed together with logic devices without incurring additional manufacturing costs.

The embodiments may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a device comprising:
   providing a substrate prepared with a memory cell region; and
   forming at least first and second memory cells on the memory cell region, wherein forming each of the memory cells comprises
   forming a split gate having first and second gates, wherein the first gate is a storage gate having a control gate over a floating gate and the second gate is a wordline, wherein forming the split gate comprises forming a floating gate dielectric over and in direct contact with the substrate,
   forming re-oxidized layers which extend from top to bottom of the control gate on sidewalls of the control gate,
   forming control gate spacers on the sidewalls of the control gate,
   forming sacrificial spacers on and in direct contact with the control gate spacers,
   removing the sacrificial spacer which is formed on the control gate spacer on a second gate side of the control gate,
   forming floating gate spacers on sides of the first gate, wherein the floating gate spacer formed on a second gate side of the first gate is in direct contact with the control gate spacer while the floating gate spacer formed on a first or an erase gate side of the first gate is in direct contact with the sacrificial spacer,
   forming a first source/drain (S/D) region adjacent to the second gate and a second S/D region adjacent to the first gate, wherein the first and second gates are coupled in series and the second S/D region being a common S/D region for adjacent first and second memory cells,
   forming a tunneling oxide layer which lines at least sidewalls of the first gates adjacent to the common S/D region and over a top surface of the common S/D region,
   forming an erase gate dielectric over the tunneling oxide layer and over the top surface of the common S/D region, and
   forming an erase gate over the common S/D region, wherein the erase gate is isolated from the common S/D region by the erase gate dielectric, a portion of the tunneling oxide layer and a portion of the floating gate dielectric over the top surface of the common S/D region, wherein a top surface of the erase gate dielectric is below a top surface of the floating gate.

2. The method of claim 1 wherein forming the split gate comprises:
   forming a floating gate electrode layer over the floating gate dielectric layer;
   forming a storage gate dielectric layer over the floating gate electrode layer;
   forming a control gate electrode layer over the storage gate dielectric layer; and
   forming a hard mask layer over the control gate electrode layer.

3. The method of claim 2 wherein forming the split gate comprises:
   patterning the hard mask and control gate electrode layers to form the control gate by an etch process, wherein the etch is highly selective to material of the control gate and stops at top surface of the storage gate dielectric layer.

4. The method of claim 3 wherein:
   the storage gate dielectric layer comprises an oxide-nitride-oxide (ONO) stack;
   the control gate electrode layer comprises polysilicon; and
   the etch process is highly selective to the polysilicon material of the control gate electrode layer and the etch process stops at nitride layer of the ONO stack.

5. The method of claim 3 wherein the re-oxidized layers are formed after patterning the hard mask and control gate electrode layers and the re-oxidized layers are aligned with sides of the patterned hard mask layer.

6. The method of claim 3 comprising forming the control gate spacers over and in direct contact with sides of the patterned hard mask and re-oxidized layers, wherein the control gate spacers comprise a top surface which is coplanar with a top surface of the hard mask and a bottom surface which is coplanar with a bottom surface of the control gate.

7. The method of claim 6 wherein the control gate spacers comprise nitride spacers.

8. The method of claim 6 comprising:
   forming the sacrificial spacers on and in direct contact with the sidewalls of the control gate spacers; and
   performing a gate threshold voltage (Vt) adjustment implant in regions of the substrate where second gates are to be formed.

9. The method of claim 8 wherein forming the split gate comprises patterning the storage gate dielectric and floating gate electrode layers after performing the Vt adjustment implant, wherein the storage gate dielectric and floating gate electrode on the second sidewall of the storage gate are aligned with the control gate spacer while the storage gate dielectric and floating gate electrode on the first sidewall of the storage gate extend beyond the control gate spacer, wherein the tunneling oxide layer is disposed over and in direct contact with a portion of the erase gate side of the storage gate dielectric.

10. A method for forming a device comprising:
providing a substrate prepared with a memory cell region; and
forming at least first and second memory cells on the memory cell region, wherein forming each of the memory cells comprises
forming a split gate having first and second gates, wherein the first gate is a storage gate having a control gate over a floating gate and the second gate is a wordline, wherein forming the split gate comprises forming a floating gate dielectric over and in direct contact with the substrate,
forming re-oxidized layers which extend from top to bottom of the control gate on sidewalls of the control gate,
forming control gate spacers on the sidewalls of the control gate,
forming sacrificial spacers on and in direct contact with sidewalls of the control gate spacers,
removing the sacrificial spacer which is formed on the control gate spacer on a second gate side of the control gate,
forming floating gate spacers on sides of the first gate, wherein the floating gate spacer formed on a second gate side of the first gate is in direct contact with the control gate spacer while the floating gate spacer formed on a first or an erase gate side of the first gate is in direct contact with the sacrificial spacer,
forming a first source/drain (S/D) region adjacent to the second gate and a second S/D region adjacent to the first gate, wherein the first and second gates are coupled in series and the second S/D region being a common S/D region for adjacent first and second memory cells,
forming a tunneling oxide layer which lines at least sidewalls of the first gates adjacent to the common S/D region and over a top surface of the common S/D region,
forming an erase gate dielectric over the tunneling oxide layer and over the top surface of the common S/D region, and
forming an erase gate over the common S/D region, wherein the erase gate is isolated from the common S/D region by the erase gate dielectric, a portion of the tunneling oxide layer and a portion of the floating gate dielectric over the top surface of the common S/D region.

11. The method of claim 10 wherein the floating gate spacers comprise high temperature oxide spacers.

12. The method of claim 10 wherein the common S/D region adjacent to the first gates of adjacent first and second memory cells is a buried source line (SL) which is formed by performing an implant process to implant first polarity type dopants in region of the substrate between the first gates of adjacent first and second memory cells, wherein the buried SL comprises a top surface which is coplanar with a top surface of the substrate.

13. The method of claim 12 comprising:
removing floating gate spacers which are formed on sidewalls of the first gates adjacent to the buried SL; and wherein
forming the tunneling oxide layer which lines sidewalls of the first gates adjacent to the buried SL and the top surface of the buried SL is performed after removing the floating gate spacers.

14. The method of claim 1 wherein the second gate and erase gate are formed simultaneously.

* * * * *